United States Patent [19]

Lakin

[11] Patent Number: 5,821,833
[45] Date of Patent: Oct. 13, 1998

[54] STACKED CRYSTAL FILTER DEVICE AND METHOD OF MAKING

[75] Inventor: Kenneth M. Lakin, Redmond, Oreg.

[73] Assignee: TFR Technologies, Inc., Bend, Oreg.

[21] Appl. No.: 578,828

[22] Filed: Dec. 26, 1995

[51] Int. Cl.$^6$ .................................................. H03H 9/00
[52] U.S. Cl. ........................................... 333/187; 310/320
[58] Field of Search .................................. 333/186–192; 310/320, 348

[56] References Cited

U.S. PATENT DOCUMENTS

| | | | |
|---|---|---|---|
| 4,349,746 | 9/1982 | Chin et al. | 333/186 |
| 5,057,801 | 10/1991 | Kittaka et al. | 333/191 |
| 5,084,647 | 1/1992 | Inoue et al. | 333/187 |
| 5,373,268 | 12/1994 | Dworsky et al. | 333/187 |
| 5,382,930 | 1/1995 | Stokes et al. | 333/191 |

OTHER PUBLICATIONS

K.M. Lakin, G.R. Kline, R.S. Ketcham, and J.T. Martin, "Stacked Crystal Filters Implemented With Thin Films," in 43rd Annual Frequency Control Symposium, May 1989, pp. 536–543.

K.M. Lakin, "Equivalent Circuit Modeling of Stacked Crystal Filters," 35th Annual Symposium on Frequency Control Proc., May 1981, pp. 257–262.

A. Ballato and T. Lukaszek, "A Novel Frequency Selective Device: The Stacked Crystal Filter," 27th Annual Frequency Control Symposium Proc., Jun. 1973, pp. 262–269.

K.M. Lakin, "Modeling of Thin Film Resonators and Filters," in Proc. IEEE MTT–S Int. Microwave Symp. Dig., Jun. 1992, pp. 149–152.

*Primary Examiner*—Benny Lee
*Assistant Examiner*—Darius Gambino
*Attorney, Agent, or Firm*—Klarquist Sparkman Campbell Leigh & Whinston, LLP

[57] ABSTRACT

A piezoelectric device includes a stacked crystal filter, a supporting substrate and an acoustic reflector between the filter and substrate for suppressing undesired resonant frequencies. The acoustic reflector includes a set of quarter wavelength layers of alternating higher and lower impedances. The reflector provides a large reflection coefficient for a bandwidth that encompasses only desired frequencies generated by the stacked crystal filter. By changing the nature of the material and the number of layers, the bandwidth and center frequency of the acoustic reflector may be varied to encompass a desired range of frequencies. To reduce the magnitude of side lobes at undesired frequencies, the impedance differences between layers of the reflector are reduced with depth into the reflector. The side lobes may also be reduced by serially connecting two stacked crystal filters having acoustic reflectors of the same material but with a different number of quarter wavelength layers.

18 Claims, 11 Drawing Sheets

STACKED CRYSTAL FILTER DEVICE AND METHOD OF MAKING

FIELD OF THE INVENTION

This invention relates generally to piezoelectric devices such as resonators and filters and, more particularly, to a stacked crystal filter device and its method of making.

BACKGROUND OF THE INVENTION

A stacked crystal filter is an acoustically coupled resonator filter that filters an electrical signal applied at its input. FIG. 1 shows an example of a stacked crystal filter 20 which includes a pair of thickness mode piezoelectric plates 22 and 24 attached to each other. Mounted between adjacent sides of the two plates is a shared electrode 26. A top electrode 28 is mounted on the opposite side 30 of plate 22 and a bottom electrode 32 is mounted on the opposite side 34 of plate 24. The top plate 22, when driven by an electrical input signal through electrodes 28 and 26, acts as an input transducer to the filter. The bottom plate 24 in turn acts as an output transducer, converting mechanical vibrations within the filter into an electrical output signal at electrodes 26 and 32. When the two plates are tightly coupled, the filter (i.e., the plates and electrodes) is resonant with the resonator boundaries extending from filter surface 36 to filter surface 38.

Although filters of this type are referred to as stacked "crystal" filters, they are not limited in the art to devices with crystal plates. Plates 22 and 24 need only be piezoelectric plates and may be made from thin films or other piezoelectric materials.

The stacked crystal filter works by resonating at a fundamental frequency and its harmonics while suppressing other signal frequencies. The filter has a thickness corresponding to half a wavelength of the desired fundamental frequency, to a full wavelength of a second harmonic frequency, to a wavelength and a half of a third harmonic frequency, and so on. The greatest degree of resonator coupling occurs at the second harmonic frequency, where the transducers are most efficient. FIG. 2 shows a typical stacked crystal filter frequency response, with 40 indicating the response at the fundamental mode, 42 indicating the response at the second harmonic frequency, and 44 indicating the response at the third harmonic frequency. The responses are not exact multiples of the fundamental frequency due to finite electrode thickness.

The problem with stacked crystal filters, as evident from FIG. 2, is the relative closeness of the multiple resonant frequencies. Ideally the stacked crystal filter should pass only frequencies in a bandwidth around a center frequency while suppressing others outside the bandwidth. But the closeness of the resonant frequencies makes this difficult without the use of other frequency suppressive techniques.

In the past, techniques have been proposed that suppress the first resonant frequency through inductor-capacitor traps and the third resonant frequency using intermediate layers added to the filter. The disadvantage of these technique is that the intermediate layers used to suppress resonant frequency 44, such as thicker electrodes, reduce the fraction of the resonator volume occupied by the piezoelectric plates. This reduction in plate volume undesirably reduces the coupling coefficient and filter bandwidth around center frequency 42.

An objective of the invention, therefore, is to provide a stacked crystal filter device that suppresses undesired resonant frequencies without the drawbacks of prior techniques. Another objective of the invention is to provide an efficient and inexpensive method for making such stacked crystal filter devices.

SUMMARY OF THE INVENTION

In accordance with the invention, a piezoelectric device comprises a stacked crystal filter, a supporting substrate for the filter, and an acoustic reflector between the filter and the substrate. The acoustic reflector is adapted to substantially suppress resonance of the filter at undesired resonant frequencies. The acoustic reflector also sufficiently reflects acoustic waves generated at a desired resonant frequency to cause the filter to resonate at that frequency.

In the preferred embodiment, the stacked crystal filter has a thickness corresponding to half the wavelength of a fundamental frequency, causing it to resonate at the fundamental frequency and its harmonics. The acoustic reflector is this embodiment is adapted to suppress resonance at the fundamental frequency and the third harmonic frequency but not at the second harmonic frequency.

The acoustic reflector may comprise a number of quarter wavelength layers of alternating higher and lower acoustic impedance. By choosing materials with known properties and an appropriate number of layers, the bandwidth of the acoustic reflector can be made sufficiently narrow so that resonance is suppressed at all but the desired resonant frequency.

The suppression of undesired resonant frequencies can be further improved by lowering the filter's side lobes. This can be done in a number of ways, such as by weighting the impedance discontinuity between layers with depth into the acoustic reflector. Another way is by serially connecting two stacked crystal filters having different acoustic reflectors. The two acoustic reflectors produce different reflection coefficients, reducing the side lobes of the signal produced by the serially connected device.

The foregoing and other objects, features, and advantages of the invention will become more apparent from the following detailed description of a preferred embodiment and the accompanying drawings

DETAILED DESCRIPTION OF PREFERRED EMBODIMENTS

Figure 3:
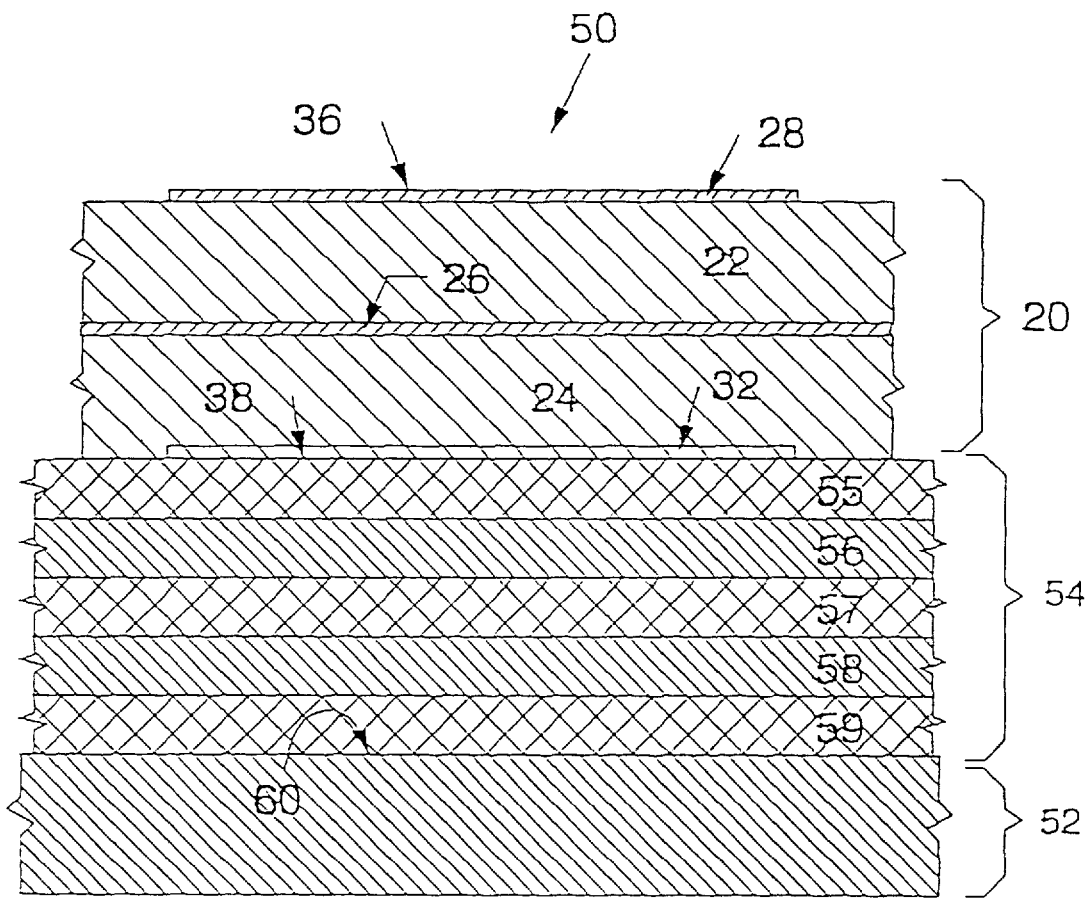
FIG. 3 is a diagram of a piezoelectric device according to the invention including a stacked crystal filter, an acoustic reflector and a supporting substrate.

FIG. 3 shows a piezoelectric device 50 constructed in accordance with the invention. The device includes a stacked crystal filter 20 having multiple resonant frequencies (e.g., a fundamental frequency, a second harmonic frequency, etc.). The stacked crystal filter is solidly mounted on a supporting substrate 52. Between the supporting substrate and the stacked crystal filter is an acoustic reflector 54 adapted to substantially suppress resonance of filter 20 at undesired resonant frequencies. The acoustic reflector sufficiently reflects acoustic waves generated by the filter at a desired resonant frequency to cause the filter to resonate at that frequency The acoustic reflector also is adapted to substantially isolate the stacked crystal filter from the effects of acoustic properties beyond the reflector, including any acoustic impedance of substrate 52. The isolation is achieved by designing the acoustic reflector to prevent acoustic waves generated by the stacked crystal filter from reaching and being reflected by the substrate.

Stacked crystal filter 20 is of the conventional design previously described. Other filter embodiments such as employing thin films, however, may also be used in accordance with the invention without departing from its principals. The thickness of filter 20 corresponds to half of the wavelength of the filter's desired fundamental resonant frequency. Multiple resonant frequencies then occur at a second harmonic frequency (double the fundamental frequency), a third harmonic frequency (triple the fundamental frequency), etc.

Substrate 52 can be of any suitable material since its acoustic properties (i.e., velocity, mechanical impedance, mechanical Q, loss characteristics, etc.) do not affect the operation of stacked crystal filter 20. Typical substrate materials include silicon, sapphire and glass.

Acoustic reflector 54 preferably comprises a plurality of quarter wave length layers 55–59, etc. of alternating higher and lower acoustic impedances for adjacent layers. Odd multiples of quarter wavelength layers may equivalently be used although quarter wavelength layers are preferred. For the purposes of this invention, both types of layers are considered quarter wavelength layers. The depth of reflector 54 is determined by its number of layers and extends from filter surface 38 to an interface 60 with substrate 52. In the present embodiment, the acoustic reflector is adapted in a manner to be described to suppress resonance at the fundamental frequency and the third harmonic frequency but not at the second harmonic frequency. Of course, the acoustic reflector could similarly be adapted to permit any of the other resonant frequencies to resonate within the filter while suppressing the rest.

Figure 4A:
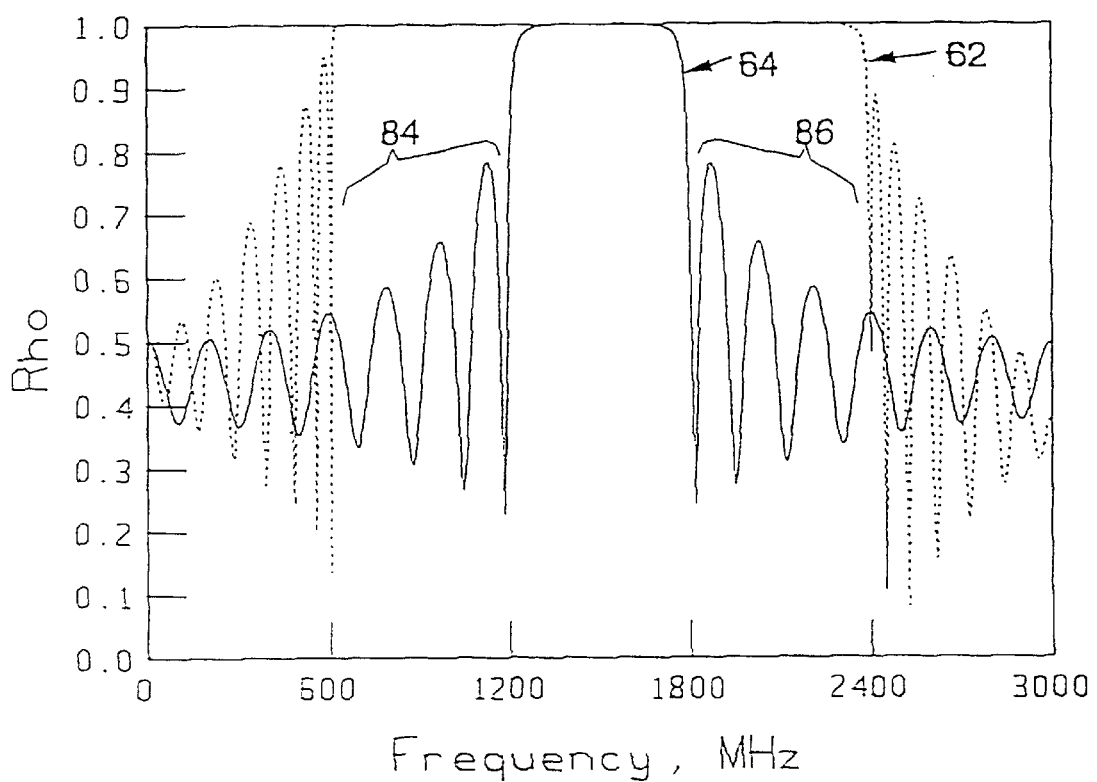
FIG. 4A is a graph of the total reflection coefficient magnitude as a function of frequency for two acoustic reflectors of different material composition.

By controlling the reflection coefficient of the quarter wavelength layers and the number of layers in the acoustic reflector, the reflector bandwidth can be made sufficiently narrow so that a filter suppresses resonance at all but a desired resonant frequency. FIG. 4A is a graph of the total reflection coefficient $\rho$ as a function of frequency for two acoustic reflectors of different material composition, measured from surface 38. The dashed line 62 shows the magnitude of the reflection coefficient for an acoustic reflector having alternating layers of tungsten and $SiO_2$ for a total of five layers. Tungsten has an acoustic impedance of 101 (units of $10^5$ gm/(s cm)$^2$) and $SiO_2$ has an acoustic impedance of 11 (units of $10^5$ gm/(s cm)$^2$ producing a reflection coefficient of magnitude 0.8 between layers.

This interlayer reflection coefficient is calculated using the following equation:

$$\rho = \frac{z-1}{z+1} \quad (1)$$

where $z=z_m/z_i$ with Zm being the acoustic impedance of the material beyond the layer interface and $z_i$ being the impedance for the material of the incident acoustic wave.

The solid line 64 shows the magnitude of the reflection coefficient for an acoustic reflector having alternating layers of $Si_3N_4$ and $SiO_2$. $Si_3N_4$ has an acoustic impedance of 19 (units of $10^5$ gm/(s cm)$^2$). In this case each layer interface has a reflection coefficient magnitude of 0.27.

Figure 4B:
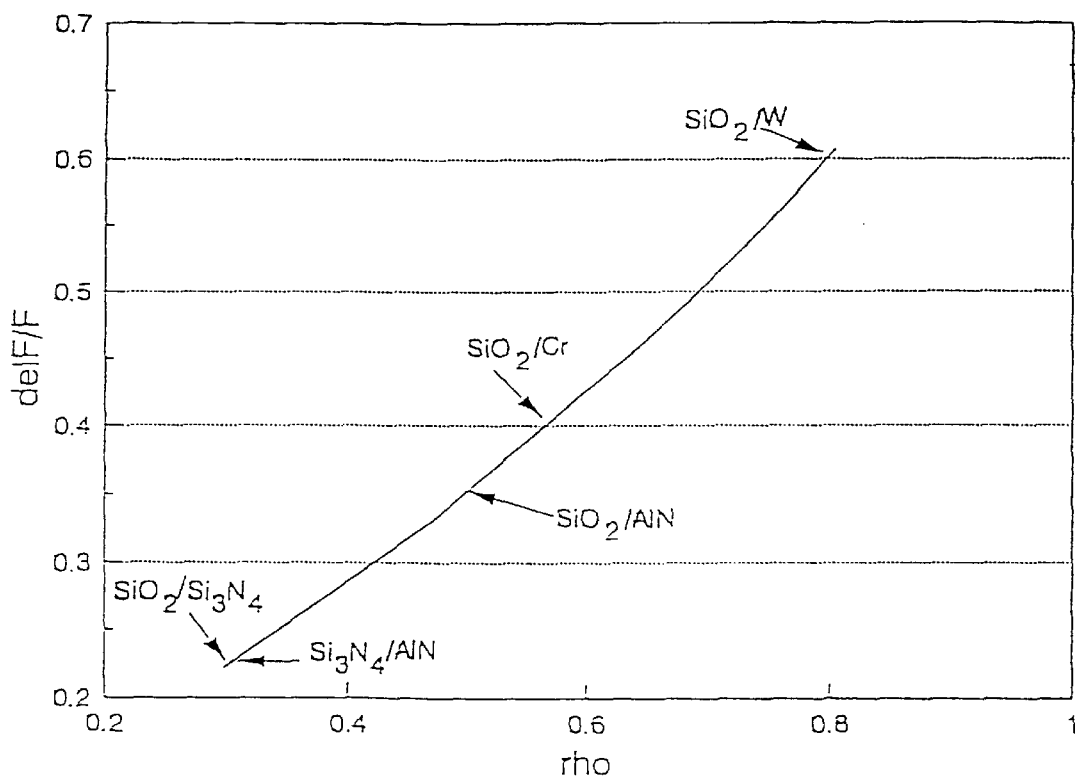
FIG. 4B is a graph of the frequency difference between the first null and the center frequency divided by the center frequency (del F/F) versus the interlayer reflection coefficient $\rho$ for a number of acoustic reflector materials.

FIG. 4B is a graph of the frequency difference between the first null and the center frequency divided by the center frequency (del F/F) versus the interlayer reflection coefficient $\rho$ for a number of materials. The figure del F/F is a measure of the bandwidth of the acoustic reflector around the center frequency, with a greater value indicating a greater bandwidth. FIG. 4B indicates that the by choosing materials that provide different reflection coefficients at their interface, the bandwidth of the reflector may be controlled.

FIGS. 4A and 4B thus show that the greater the reflection coefficient at each layer within the acoustic reflector, the wider the bandwidth around the reflector's center frequency. The reason for this is the following. The acoustic waves from each quarter wavelength layer interface must add in phase at the surface of the reflector (surface 38 in FIG. 3, for example) to make a sufficiently large reflection for resonance to occur. In the acoustic reflector represented by line 62, each layer interface reflection is strong and only five layers are needed. In the acoustic reflector represented by line 64, the reflections at the layer interfaces are weaker and fifteen layers are required to produce resonance. The phases of individual waves are proportional to the apparent round trip distance from the reflector surface to the point of reflection and return and to the wave frequency. The rate of change of the phase of the reflected wave is thus proportional to the distance traveled. With a smaller reflection at each layer interface, the acoustic wave penetrates deeper into the reflector and the phase of the reflection from deeper layers changes faster with frequency. The reflection null closest to the center frequency is caused by destructive interference of wave reflections from deeper in the reflector. The required 180 degree phase shift for destructive interference is proportional to the distance traveled by the wave and the frequency offset from constructive interference. Thus deeper wave penetration requires less frequency offset to get 180 degrees so the first reflection null is closer to the center frequency of the reflector. The distance to the apparent point of reflection is defined implicitly by the interference condition, the frequency offset at the null, and an average velocity of the materials in the path. With a larger reflection at each layer interface, the acoustic wave penetrates a shorter distance through fewer layers. A much wider change of frequency from the quarter wavelength frequency is allowed before interference results (the deep notches).

The number of layers used in acoustic reflector 54 thus depends upon the nature of the layer materials. If the materials produce a lower reflection coefficient at each layer interface (for a narrower reflector bandwidth), then more layers are required to provide the desired total reflection. If the materials produce a greater reflection coefficient at each layer interface (for a wider reflector bandwidth), then more layers are required to provide the desired total reflection.

Given a desired reflector bandwidth and the nature of materials at hand, acoustic reflector can be constructed analytically through calculations as described below and through compiled data such as shown in FIG. 4B. An example of how to construct an acoustic reflector is given in my copending patent application entitled "Piezoelectric Resonator and Method of Making," Ser. No. 08/574,334, filed Dec. 18, 1995, which is hereby incorporated by reference. Alternatively, computer simulation may be used to determine the construction of the acoustic reflector.

The analysis of the reflector structure comprising quarter wavelength layers is most conveniently done using two fundamental equations of wave propagation. The total reflection from a material discontinuity is also given by equation (1), where $Z=Z_m/Z_i$ with $Z_m$ being the impedance of the material beyond the interface and $Z_i$ being the impedance for the region of the incident wave. Across material sections effective impedances due to standing waves are given by the transmission line equation:

$$Z_{in} = Z_0 \left[ \frac{Z_t \cos\theta + jZ_0 \sin\theta}{Z_0 \cos\theta + jZ_t \sin\theta} \right] \quad (2)$$

where $Z_{in}$ is the input impedance, $Z_t$ the load impedance, $Z_o$ the characteristic impedance of the plate, and $\theta$ the total phase across the section.

For an ideal free surface (zero force) z=0 and for an ideal clamped surface (zero particle motion) z must be much larger than unity. Therefore if the total reflection by acoustic reflector 54 at interface 38 is large enough, a free ($\rho=-1$) or a clamped ($\rho=1$) surface can be synthesized. An air or vacuum interface can accurately approximate a free surface yet no known single material can form an adequately clamped surface, for high Q resonator purposes.

For multiple layers the impedance at the reflector interface is derived from a recursion relation for quarter wavelength layers:

$$Z_{iq} = Z_q^2 / Z_{i(q+1)} \quad (3)$$

where subscript i denotes the input impedance of a quarter wavelength section. By numbering sections from the top of the reflector, the effective normalized impedance is $$z = \left(\frac{Z_1}{Z_p}\right)\left(\frac{Z_1}{Z_2}\right)\left(\frac{Z_3}{Z_2}\right)\left(\frac{Z_3}{Z_4}\right)\ldots = \left(\frac{1+\rho_{p1}}{1-\rho_{p1}}\right)\left(\frac{1-\rho_{12}}{1+\rho_{12}}\right)\left(\frac{1-\rho_{34}}{1+\rho_{34}}\right)\ldots \quad (4)$$

where $Z_p$ is the impedance of the piezoelectric region and the subscripted reflection coefficients are for the indicated interface. With appropriate subscript, the impedance in (4) can be used in well known equations to calculate the electrical impedance of a piezoelectric plate. The first part of (4) is in a familiar circuit impedance form whereas the second part is more physical in describing the reflector phenomenon as a composite of surface reflections at a number of interfaces. If the odd layers are of low impedance relative to the even layers then the successive reflections give rise to a low impedance and apparent free surface. If the odd layer impedances are high and the even layers low impedance then the interface appears approximately clamped. From equations(1) and (4) it is clear that with this method quarter wavelength layers are added until the desired reflection coefficient and interface impedance are obtained.

Figure 1:
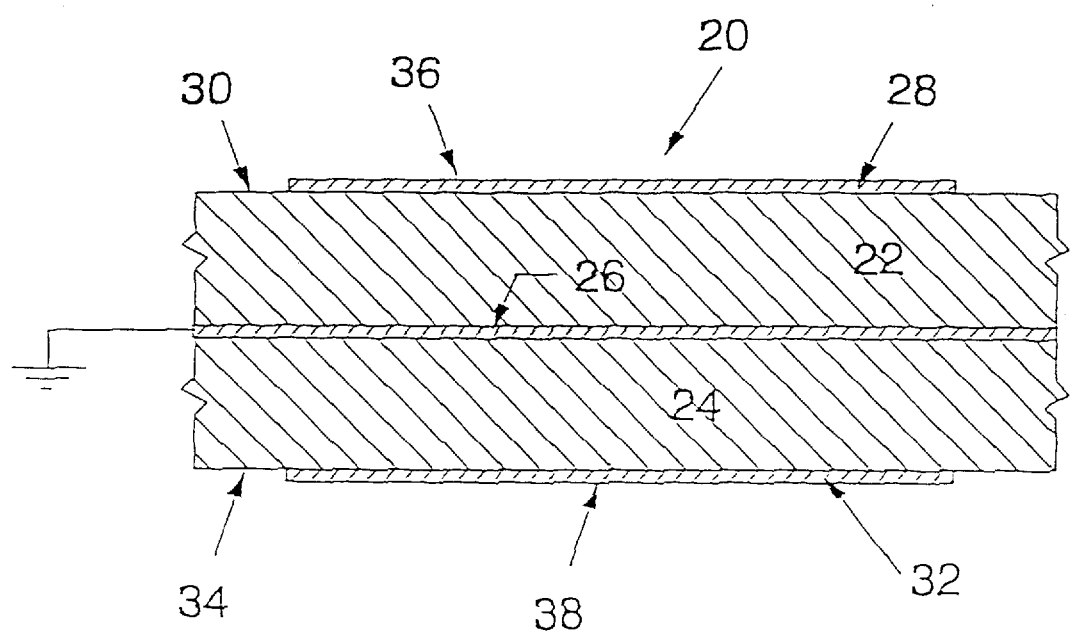
FIG. 1 is a diagram of a conventional stacked crystal filter.
Figure 2:
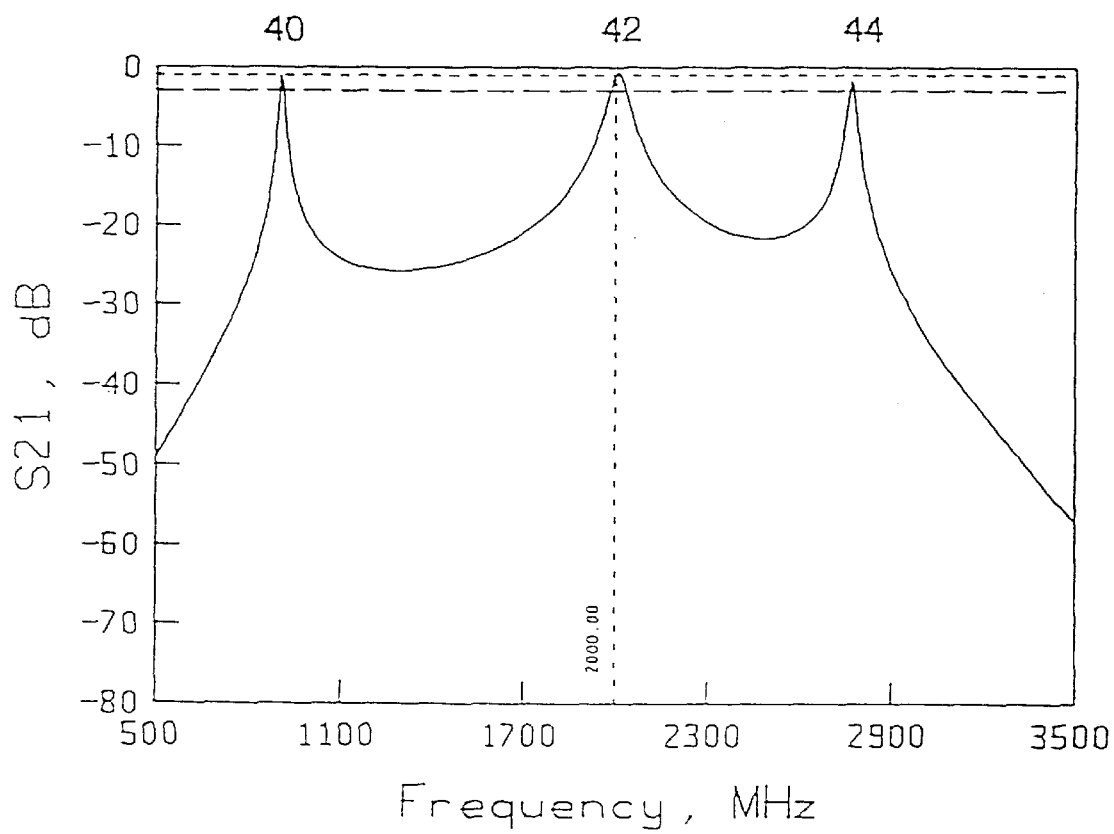
FIG. 2 is graph of the frequency response of the stacked crystal filter of FIG. 1., showing the peak responses at the fundamental and several harmonic frequencies.
Figure 5:
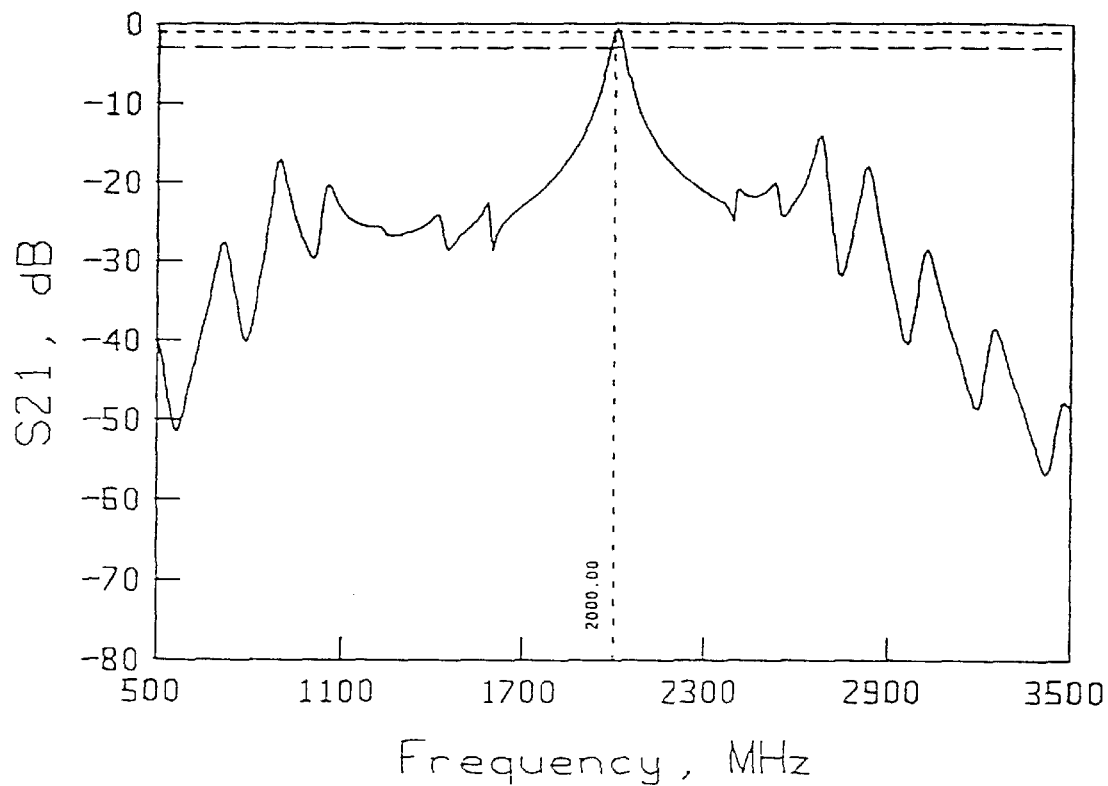
FIG. 5 is a graph of the frequency response of piezoelectric device of FIG. 3 showing the suppressive effects of one of the acoustic reflectors graphed in FIG. 4.

FIG. 5 is a graph of the frequency response of piezoelectric device of FIG. 3 showing the suppressive effects the acoustic reflector represented by line 64 in FIG. 4A. In this example the piezoelectric plates are 2.7 micrometer thick AlN, the electrodes are 0.1 micrometer thick Al, the $SiO_2$ layers are 0.563 micrometers thick, and the $Si_3N_4$ layers are 1.0 micrometer thick. The acoustic reflector has 15 alternating $SiO_2/Si_3N_4$ layers. In comparing this frequency response to that of the device shown in FIG. 2, it can be seen that the fundamental frequency and the third harmonic frequency responses are substantially suppressed in the device of FIG. 3. It should be understood that connecting two filter sections in series also reduces spurious responses at some expense to in-band insertion loss.

Figure 6:
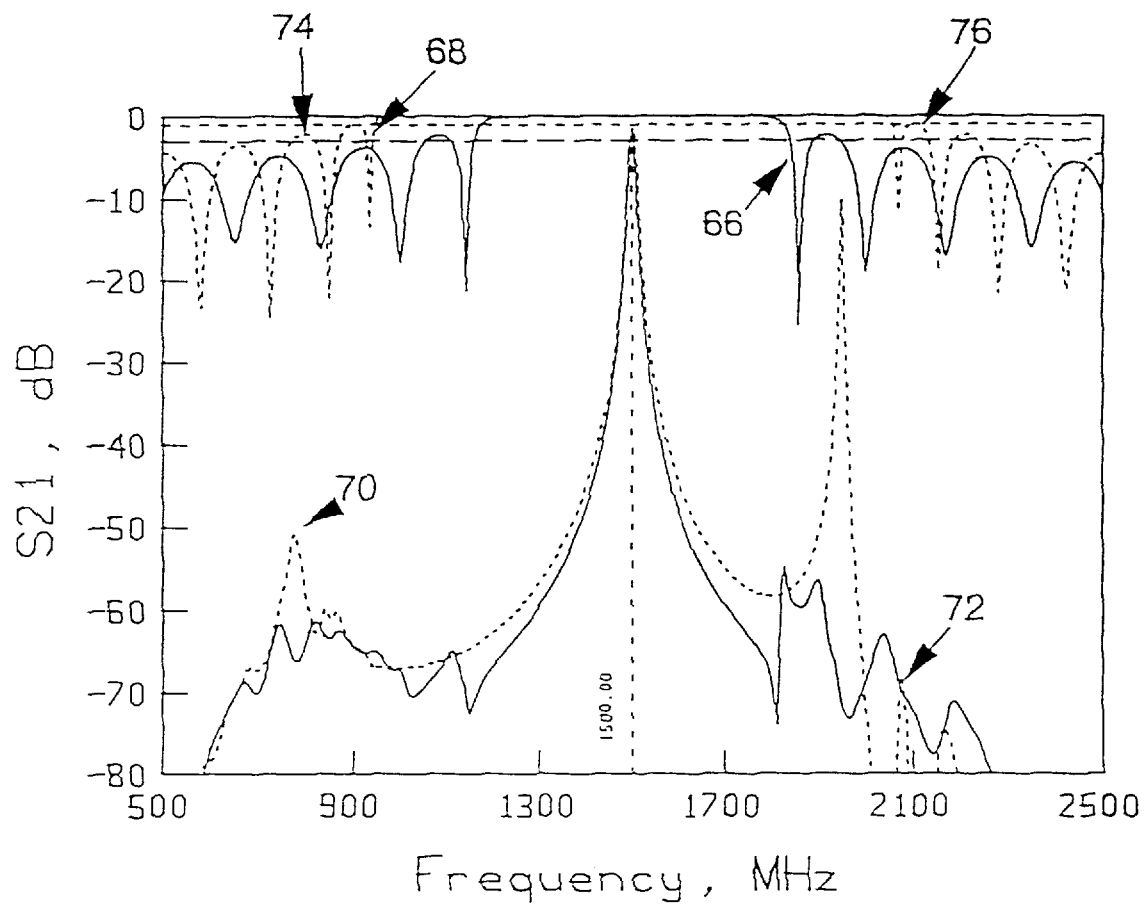
FIG. 6 is a graph of the frequency responses and reflection coefficient magnitudes of two piezoelectric devices constructed with different acoustic reflectors in accordance with the invention.

The optimum reflector for manufacturing purposes is one having the fewest number of quarter wavelength layers in the acoustic reflector. Fewer layers require that there be a larger impedance difference between alternating layers. This produces a wider reflection bandwidth as shown in FIG. 4A. A particular frequency can be suppressed by positioning a reflection null at that frequency. FIG. 6 shows an example of a reflection null where an acoustic reflector (indicated by the solid line 66) is composed of alternating layers of $Si_3N_4$ and AlN. The null (indicated by the notch in the magnitude) is positioned at the third harmonic frequency, thereby suppressing it. This suppression is in contrast to the result where the reflector (indicated by the dashed line 68) is composed of alternating layers of $SiO_2$ and AlN. In this latter case the bandwidth of the filter is wider and encompasses the third harmonic frequency.

The center frequency of the acoustic reflector 54 can be shifted relative to the stacked crystal filter 20 during manufacturing to position a reflection null at an appropriate frequency. This shifting is done by changing the thickness slightly of the reflector layers away from a quarter wavelength thickness. The shift in center frequency is inversely proportional to the thickness change.

The side lobes of stacked crystal filter 20 such as lobes 70 and 72 in FIG. 6 are due to side lobes 74 and 76 of the reflection coefficient of acoustic reflector 54. The side lobes of the reflector are at a frequency spacing that is dependent on the apparent length of the reflector itself. The filter side lobes can be significantly reduced by reducing the side lobes of the reflector.

Figure 7:
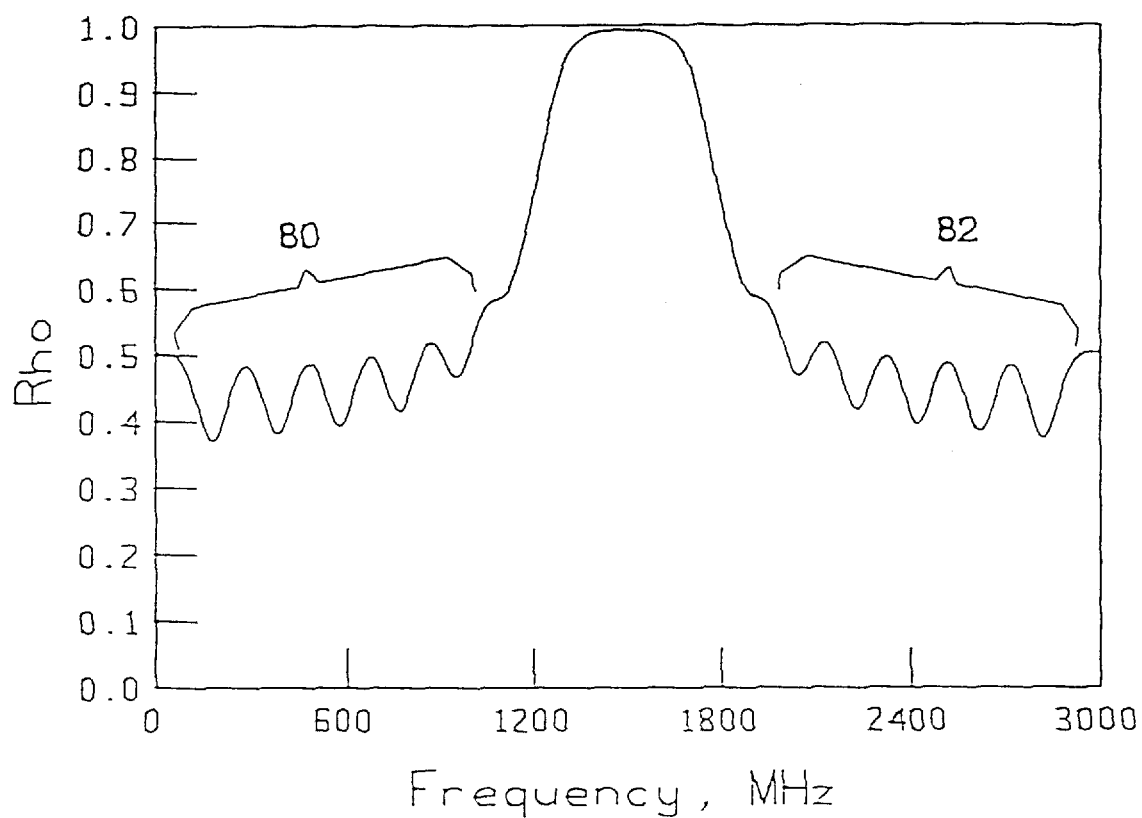
FIG. 7 is a graph of the reflection coefficient magnitude as a function of frequency for an acoustic reflector in which the difference in acoustic impedances between layers of the reflector diminishes with depth into the acoustic reflector.

One way of reducing the reflector side lobes is by tapering the degree of impedance discontinuity with depth of the reflector. By such tapering, the difference in acoustic impedances between adjacent quarter wavelength layers diminishes with depth into the acoustic reflector. The tapering is often referred to as apodization in antennas or SAW transducers. FIG. 7 shows the magnitude of the reflection coefficient for the $Si_3N_4/SiO_2$ acoustic reflector as a function of frequency, where the impedance discontinuity between layers linearly tapers with reflector depth. The magnitude for the same acoustic reflector without the linear taper is shown by line 64 in FIG. 4A. In comparison to FIG. 4A, the side lobes 80 and 82 of the reflector in FIG. 7 are greatly reduced in magnitude relative to side lobes 84 and 86 of the reflector in FIG. 4A. In addition to a linear taper, other well known weighting functions may be used, such as cosine and cosine on a pedestal, that serve to reduce the effects of minor reflections yet preserve a strong central reflection.

A preferred method of tapering the impedance discontinuity is to alter the materials or material properties within each reflector layer of reflector 54. For example, in a reflector made with $Si_3N_4$ and $SiO_2$ layers, the amount of oxygen in the $Si_3N_4$ at various layers can be controlled during deposition to make the acoustic (i.e., mechanical) impedance of the oxynitride approach that of $SiO_2$. Similarly, if the high impedance layers are composed of AlN, then the low impedance layers can be changed from $SiO_2$ near filter surface 38 to $Si_3N_4$ near substrate surface 60 to produce a taper on a pedestal effect. The reflection coefficient thus changes as a function of reflector depth.

Figure 8:
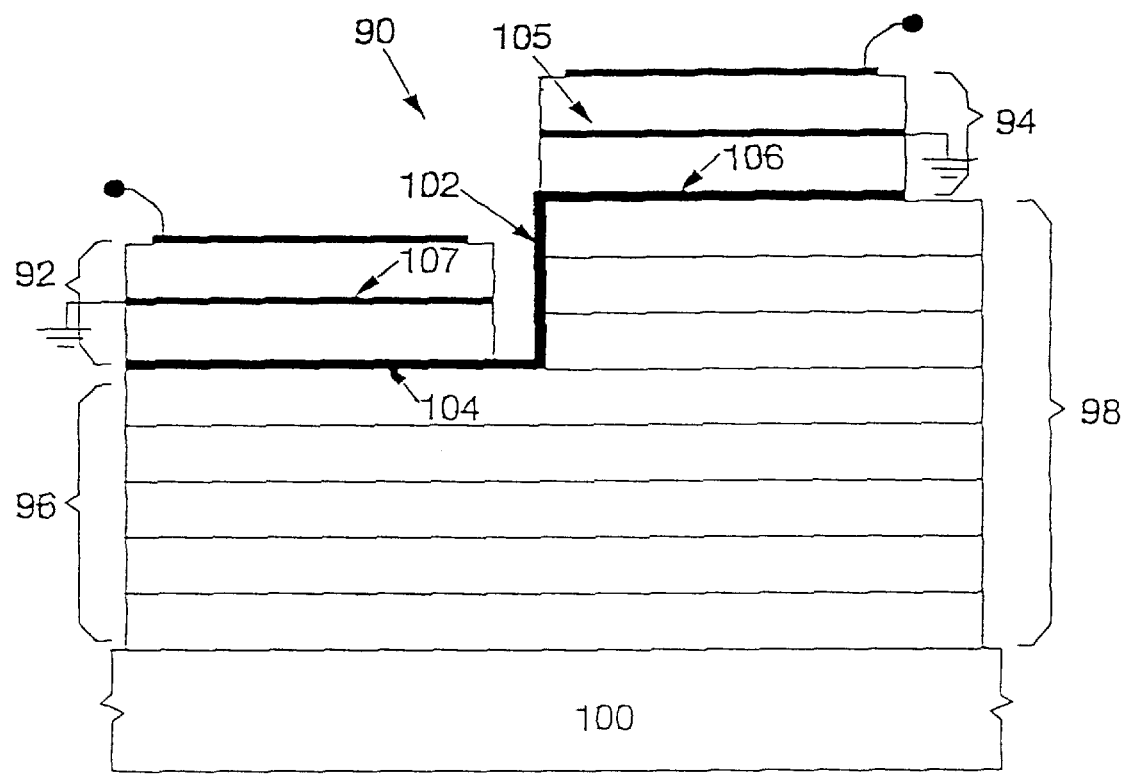
FIG. 8 is a diagram of a piezoelectric device comprising a pair of serially connected stacked crystal filters with different acoustic reflectors in accordance with the invention.

Another way of reducing the effect of reflector side lobes is to serially connect two stacked crystal filter sections that have different acoustic reflectors. FIG. 8 is a diagram of a piezoelectric device 90 comprising a pair of serially connected stacked crystal filter sections 92 and 94 with different acoustic reflectors in accordance with the invention. Filters 92 and 94 are identical in design and thus have the same resonant frequencies. Attached to filter 92 is an acoustic reflector 96 with a first number of layers such as 11. Attached to filter 94 is an acoustic reflector 98 of the same material as reflector 96 but with a second, different number of layers such as 13. Both acoustic reflectors are mounted on a common substrate 100. The two filters are serially connected by a conductor 102 connecting electrodes 104 and 106. Shared electrodes 105 and 107 are connected to a common ground.

Because the acoustic reflectors in device 90 have a different number of quarter wavelength layers, they have different side lobes. For the case of an $SiO_2$ and $Si_3N_4$ layer sequence having an interlayer reflection coefficient magnitude of 0.27, approximately 15 layers are required to isolate a filter 20 from the substrate. In this case adding more layers does not shift the position of the side lobe nulls because no waves of significant amplitude reach the lower layers. However, by reducing the number of layers, such as to 11 and 13 in this example, the reflector-to-substrate interface 60 has a noticeable effect on the side lobe nulls.

Figure 9:
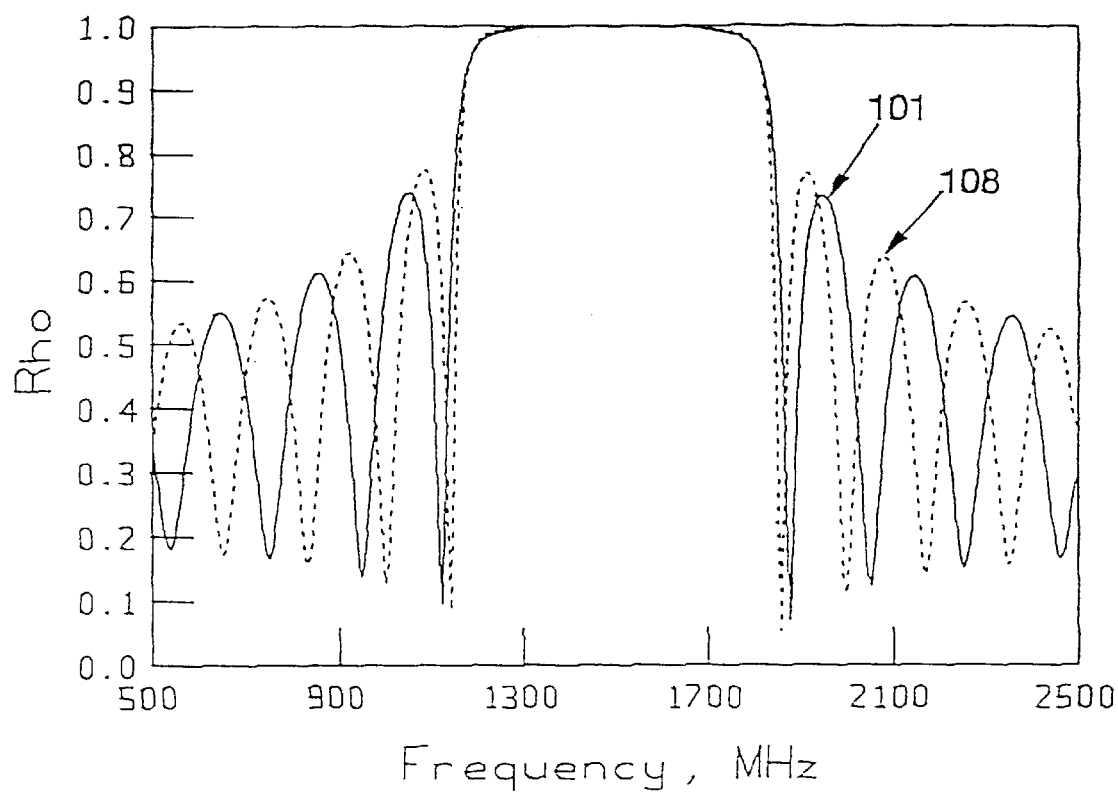
FIG. 9 is a graph of the reflection coefficient magnitude as a function of frequency for the two acoustic reflectors used in the piezoelectric device of FIG. 8.
Figure 10:
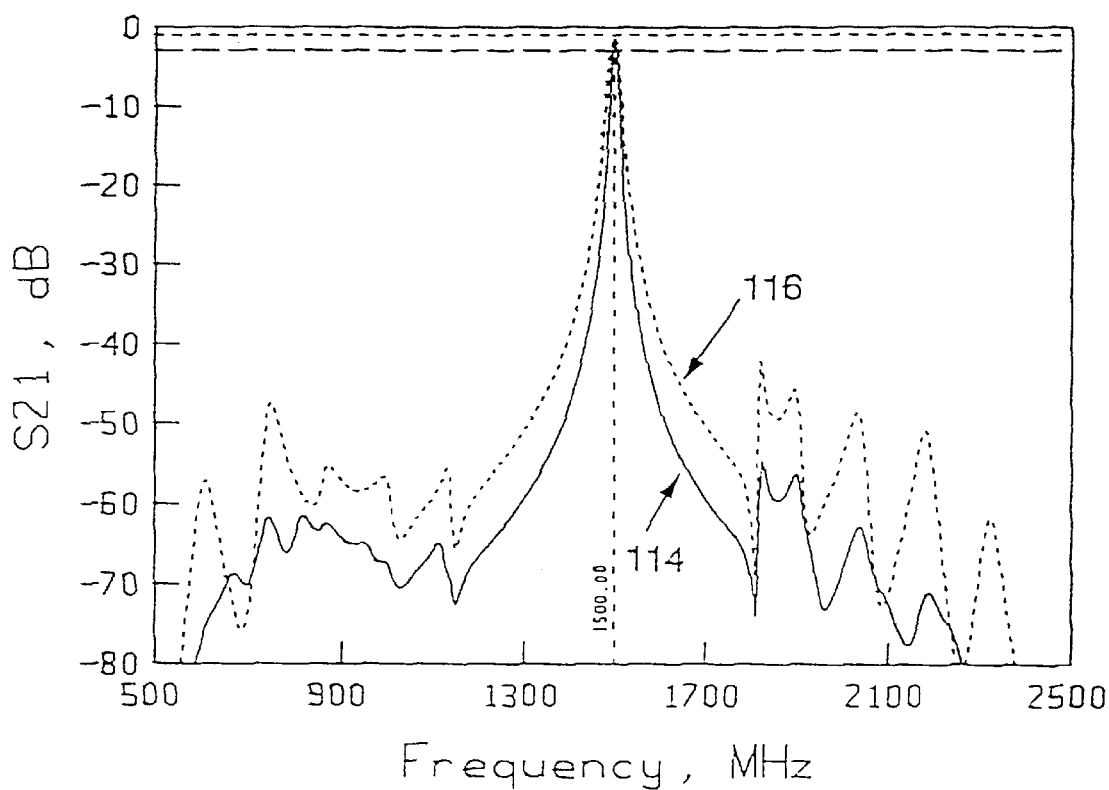
FIG. 10 is a graph of the frequency response of the piezoelectric device of FIG. 8.

This difference is evident in the graph of FIG. 9. The dotted line 108 represents the magnitude of the reflection coefficient for the acoustic reflector with the greater number of layers. The solid line 110 represents the magnitude of the reflection coefficient for the acoustic reflector with the fewer number of layers. The slight shift in the first null is due to the weak reflection at the reflector to substrate interface. The reflection is strongest for the 11 layer reflector. At frequencies more removed from the first null, the overall reflection coefficient is less, the wave at the reflector to substrate interface is stronger, the interface has a more pronounced effect on the total reflection, and thus the nulls are farther apart in frequency for the 11 and 13 layer reflectors. The effect of the different reflection coefficients on the frequency response of piezoelectric device 90 is shown in the solid line 114 graphed in FIG. 10. For comparison, the frequency response of a similar piezoelectric device but with acoustic reflectors having an equal number of layers is requested by the dotted line 116. The result is a significant reduction in the side lobes of the device response when the acoustic reflectors have different numbers of quarter wavelength layers.

FIG. 8 shows the two filters as separate devices for the purpose of illustration only. In manufacturing a series connected stacked crystal filter device, filters 92 and 94 can be integrated monolithically.

Having illustrated and described the principles of the invention in several preferred embodiments, it should be apparent to those skilled in the art that these embodiments can be modified in arrangement and detail without departing from such principles. For example, the described sequence of steps for making stacked crystal filter devices in accordance with the invention may be changed without affecting the invention; other sequences may also be used. The piezoelectric plates may be composed of any suitable piezoelectric material. The acoustic reflector may be constructed to encompass more than one desired resonant frequency. And the acoustic reflector may be adapted to suppress one resonant frequency. In view of the many possible embodiments to which the principles of the invention may be applied, it should be recognized that the illustrated embodiments are only preferred examples of the invention and should not be taken as limitations on its scope. The invention is defined by the following claims. I therefore claim as the invention all that comes within the spirit and scope of these claims.

I claim:

1. A piezoelectric device, comprising:
   a stacked crystal filter having multiple resonant frequencies;
   a supporting substrate for solidly mounting the stacked crystal filter; and
   an acoustic reflector between the stacked crystal filter and the substrate, the reflector adapted to substantially suppress resonance of the filter at one or more of the multiple resonant frequencies and to sufficiently reflect acoustic waves generated at another of the multiple resonant frequencies to cause the filter to resonate at the other frequency.

2. The piezoelectric device of claim 1 wherein the stacked crystal filter has a thickness corresponding to half the wavelength of a fundamental resonant frequency and the multiple resonant frequencies include the fundamental frequency, a second harmonic frequency and a third harmonic frequency.

3. The piezoelectric device of claim 2 wherein the acoustic reflector is adapted to suppress resonance at the fundamental frequency and the third harmonic frequency but not at the second harmonic frequency.

4. The piezoelectric device of claim 1 wherein the stacked crystal filter comprises a pair of piezoelectric plates, a shared electrode between adjacent sides of the plates, a top electrode on a side of one plate opposite the side adjacent to the shared electrode and a bottom electrode on a side of the other plate opposite the side adjacent to the shared electrode.

5. The piezoelectric device of claim 4 wherein the piezoelectric plates are crystal plates.

6. The piezoelectric device of claim 4 wherein the piezoelectric plates are thin films.

7. The piezoelectric device of claim 1 wherein the acoustic reflector comprises a plurality of quarter wave length layers of alternating higher and lower acoustic impedances for adjacent layers.

8. The piezoelectric device of claim 7 wherein the difference in acoustic impedances between adjacent quarter wavelength layers diminishes with depth into the acoustic reflector.

9. The piezoelectric device of claim 1 wherein the stacked crystal filter is serially connected to a second stacked crystal filter, each filter attached to an acoustic reflector with a different reflection coefficient.

10. The piezoelectric device of claim 9 wherein the acoustic reflectors each comprise a plurality of quarter wavelength layers of the same material but of a different number of layers.

11. A method of fabricating a piezoelectric device, the method comprising the following steps:
    determining from a stacked crystal filter its multiple resonant frequencies:

attaching an acoustic reflector to the stacked crystal filter, the acoustic reflector adapted to substantially suppress resonance of the filter at one or more resonant frequencies and to sufficiently reflect acoustic waves generated at another of the resonant frequencies to cause the filter to resonate at the other frequency; and attaching the acoustic reflector to a supporting substrate.

12. The method of claim 11 wherein the step of attaching the acoustic reflector to the stacked crystal filter comprises attaching a series of quarter wavelength layers of alternating higher and lower acoustic impedance for adjacent layers to the filter.

13. The method of claim 12 including tapering the difference in acoustic impedances between adjacent quarter wavelength layers with depth into the acoustic reflector.

14. The method of claim 12 including tapering the difference in acoustic impedances between adjacent quarter wavelength layers with depth into the acoustic reflector by altering the material or the material properties of the layers to change their acoustic impedances.

15. The method of claim 11 including:

serially connecting the stacked crystal filter to a second stacked crystal filter; and attaching to each filter an acoustic reflector with a different reflection coefficient such that side lobes of the two filters do not substantially overlap in frequency.

16. The method of claim 15 wherein the acoustic reflectors each comprise a plurality of quarter wavelength layers of the same material but of a different number of layers.

17. A piezoelectric device, comprising:

a stacked crystal filter comprising a pair of piezoelectric plates, a shared electrode between adjacent sides of the plates, a top electrode on a side of one plate opposite the side adjacent to the shared electrode and a bottom electrode on a side of the other plate opposite the side adjacent to the shared electrode, the stacked crystal filter being a half wavelength thick corresponding to a fundamental frequency and having multiple resonant frequencies including the fundamental frequency, a second harmonic frequency and a third harmonic frequency;

a supporting substrate for solidly mounting the stacked crystal filter; and an acoustic reflector between the stacked crystal filter and the substrate, the reflector comprising a sufficient number of quarter wave length layers of alternating higher and lower acoustic impedances to substantially suppress resonance of the filter at the fundamental frequency and the third harmonic frequency but not at the second harmonic frequency and to sufficiently reflect acoustic waves generated at the second harmonic frequency to cause the filter to resonate at that frequency.

18. The piezoelectric device of claim 17 wherein the difference in acoustic impedances between adjacent quarter wavelength layers diminishes with depth into the acoustic reflector.

* * * * *